United States Patent [19]

Osano

[11] Patent Number: 5,854,795
[45] Date of Patent: Dec. 29, 1998

[54] MEMORY CAPACITY TEST METHOD AND COMPUTER SYSTEM

[75] Inventor: Yuichi Osano, Yokohama, Japan

[73] Assignee: Kikusui Electronics Corporation, Yokohama, Japan

[21] Appl. No.: 801,919

[22] Filed: Feb. 14, 1997

[30] Foreign Application Priority Data

Feb. 16, 1996 [JP] Japan ................................. 8-029726

[51] Int. Cl.$^6$ ............................................. G11C 29/00
[52] U.S. Cl. ........................................... 371/21.1; 365/201
[58] Field of Search ............................... 371/21.1, 21.2, 371/21.6, 24, 10.2, 10.3, 71; 395/182.05, 185.06, 182.07, 183.18; 365/200, 201; 364/245, 245.2, 245.3, 246.3, 265.3, 268.3, 268.5, 944, 944.2, 966.4, 970, 970.1; 711/102, 103, 104, 105, 133, 134

[56] References Cited

U.S. PATENT DOCUMENTS

| | | | |
|---|---|---|---|
| 4,479,214 | 10/1984 | Ryan | 371/21.6 |
| 4,535,455 | 8/1985 | Peterson | 371/21.6 |
| 4,943,910 | 7/1990 | Nakamura | 364/246.3 |
| 5,388,104 | 2/1995 | Shirotori et al. | 371/22.35 |

*Primary Examiner*—Trinh L. Tu
*Attorney, Agent, or Firm*—Finnegan, Henderson, Farabow, Garrett & Dunner, L.L.P.

[57] ABSTRACT

A memory capacity test method capable of confirming the memory capacity of an actually mounted memory in a short time in a memory system which mounts a memory only on a portion of a memory space. The method writes first data to a check address which is an n-th power of two, and then second data to the address 0, where the second data differs from the first data, and decides that the memory is not mounted on the check address if the data read from the check address disagrees with the first data. This is based on the fact that the check address actually points the address 0 when the memory is not mounted on the check address of the nth power of two, and hence the second data is written over the first data on the address 0 in that case.

5 Claims, 4 Drawing Sheets

MEMORY CAPACITY TEST METHOD AND COMPUTER SYSTEM

BACKGROUND OF THE INVENTION

1. Field of the Invention

The present invention relates to a memory capacity test method and a computer system implementing the same, which test a range on which a memory is mounted in the memory space of a microprocessor.

The contents of application Ser. No. 8-029726, filed Feb. 16, 1996, in Japan is hereby incorporated by reference.

2. Description of Related Art

A conventional memory check is carried out by writing data sequentially on areas in the memory space at access unit intervals, followed by verifying whether or not the written data can be read correctly, and decides that the memory is not mounted at addresses with which the data cannot be correctly written or read.

The conventional memory check, however, takes a long time to cover the entire memory areas because it performs writing and reading of the data for the entire memory areas at the access unit (for example, byte) intervals.

In addition, some microcomputer systems use only lower addresses in the memory space, in which case they decode only lower addresses, and ignore the upper addresses. In such systems, since the conventional memory check method accesses only to the lower addresses on which the memory is mounted, ignoring the upper addresses, it cannot check the capacity of the memory actually mounted. This will be explained in more detail with reference to FIG. 4.

In FIG. 4, 20-bit address notation is used, in which only 1024 bits are actually mounted. Since the 1024-bit area can be represented by 10 bits, this system decodes only the lower 10 bits out of the 20 bits to access the memory, thereby ignoring the upper 10 bits. Accordingly, even if access is required to the address whose 11-th bit is one and the remaining bits are all zero, the actual access is made to the address whose bits are all zero because the 11-th bit is ignored. Thus, only the lower 10 bits are used which correspond to the mounted 1024-bit area, ignoring the remaining memory area corresponding to the upper 10 bits which is shown as an image memory in FIG. 4.

The conventional memory checking method, when applied to such a system, will repeatedly check only part of the memory space on which the memory is mounted. Thus, the write and read to and from the memory area on which the memory is not mounted are changed to the write and read to and from the memory area on which the memory is mounted. This makes it difficult to recognize the capacity of the memory which is really mounted.

SUMMARY OF THE INVENTION

It is therefore an object of the present invention to provide a memory capacity test method and a computer system implementing the same, which can confirm the capacity of a mounted memory in a short time in a system in which a memory is mounted merely part of the memory space, and only the addresses are decoded corresponding to the mounted memory areas.

In a first aspect of the present invention, there is provided a memory capacity test method for testing capacity of a memory system which includes a memory mounted only on a portion of a memory space, and decodes only addresses of the portion of the memory space, the memory capacity test method comprising the steps of:

sequentially selecting a check address;

writing first data to the check address;

writing second data to an initial address of the portion on which the memory is mounted, the second data being different from the first data;

reading data on the check address;

checking whether the data read from the check address agrees with the first data; and deciding that the memory is not mounted on the check address if the data read from the check address disagrees with the first data.

In a second aspect of the present invention, there is provided a memory capacity test method for testing capacity of a memory system, the memory capacity test method comprising the steps of:

sequentially selecting a check address;

writing first data to the check address;

writing second data to an initial address of a portion on which a memory is mounted, the second data being different from the first data;

reading data on the check address;

checking whether the data read from the check address agrees with the first data or with the second data;

deciding that the memory is not mounted on the check address if the data read from the check address disagrees with the first data;

deciding that the check address is decoded but the memory is not mounted on the check address if the data read from the check address disagrees with the first data and the second data; and deciding that the memory is mounted on the address if the data read from the check address agrees with the first data.

Here, the memory capacity test method may further comprise the step of deciding that no memory is mounted if data written to an initial address of an area, on which a memory is considered to be mounted, is not read correctly.

The check address sequentially selected may be set at an n-th power of two, where n is zero, or a positive integer.

In a third aspect of the present invention, there is provided a computer system comprising:

computer readable program code means for causing the computer system to sequentially select a check address from a memory;

computer readable program code means for causing the computer system to write first data to the check address;

computer readable program code means for causing the computer system to write second data to an initial address of a portion on which the memory is mounted, the second data being different from the first data;

computer readable program code means for causing the computer system to read data of the check address;

computer readable program code means for causing the computer system to check whether data read from the check address agrees with the first data; and computer readable program code means for causing the computer system to decide that the memory is not mounted on the check address if the data read from the check address disagrees with the first data.

The above and other objects, effects, features and advantages of the present invention will become more apparent from the following description of the embodiment thereof taken in conjunction with the accompanying drawings.

DETAILED DESCRIPTION OF PREFERRED EMBODIMENT

The invention will now be described with reference to the accompanying drawings.

Figure 1:
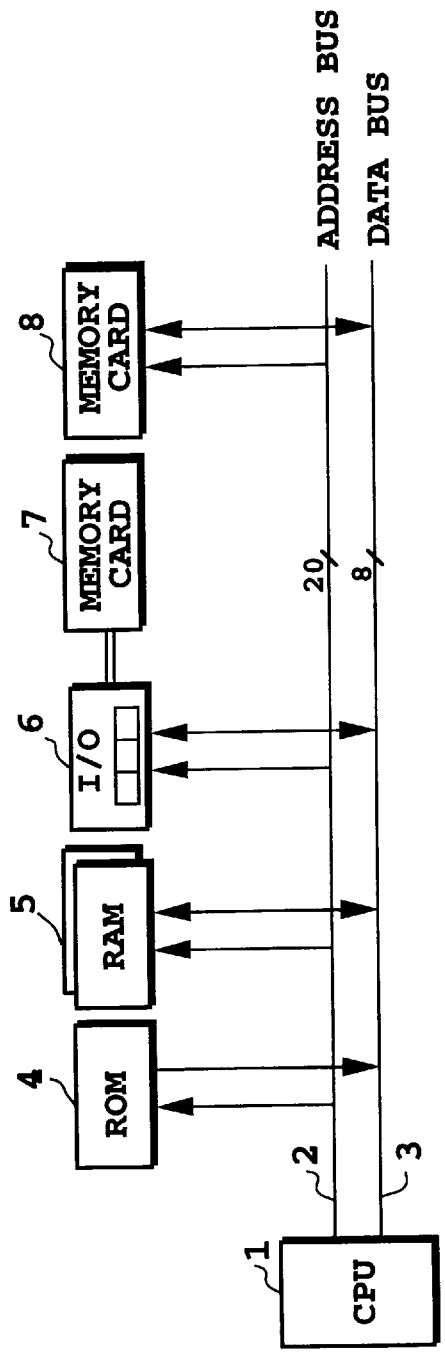
FIG. 1 is a block diagram showing an embodiment of a microcomputer system in accordance with the present invention.

FIG. 1 is a block diagram showing a configuration of a microcomputer system in accordance with the present invention. In FIG. 1, the reference numeral 1 designates a CPU including a microprocessor. The reference numeral 2 designates a 20-bit address bus, 3 designates an 8-bit data bus. The reference numeral 4 designates a ROM (Read Only Memory), and 5 designates a RAM (Random Access Memory), each connected to the address bus 2 and the data bus 3. The ROM 4 stores programs of the system, and the RAM 5 is used to store data during the operation of the system. The capacity of the RAM 5 is variable and determined depending on equipment to which the microcomputer system is applied. The reference numerals 7 and 8 designate memory cards. The memory card 7 is connected to the buses 2 and 3 through an I/O interface 6, and the memory card 8 is directly connected to the buses 2 and 3.

As mentioned above, the capacity of the RAM 5 is variable, and the system decodes only the lower address bits needed for covering the RAM with that capacity. The capacity of the RAM 5 is generally expressed by the n-th power of two in a system with such an address structure, where n is a positive integer.

Figure 2:
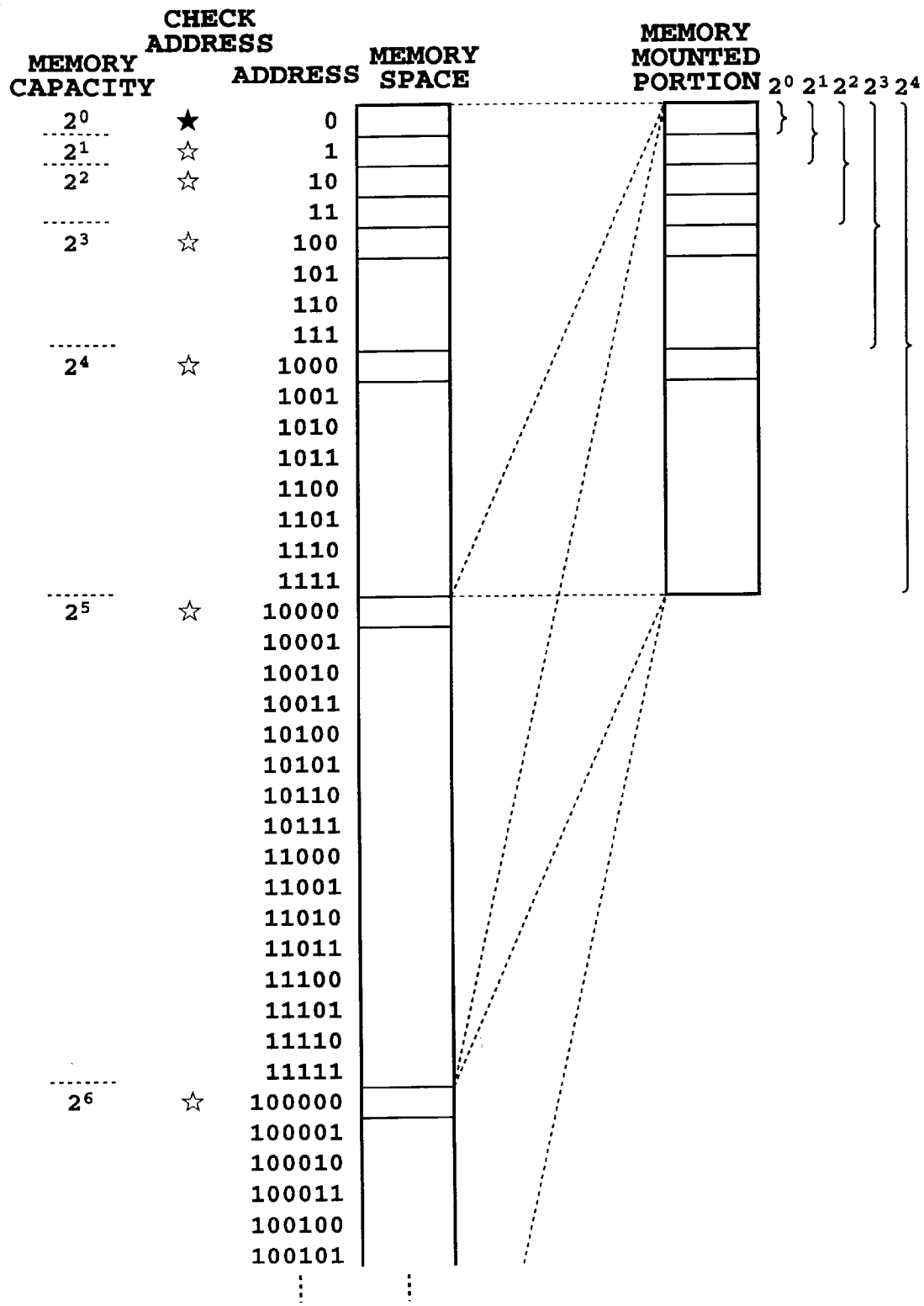
FIG. 2 is a schematic diagram illustrating a state of a mounted memory, and a test method thereof.

FIG. 2 is a diagram illustrating the state of the mounted memory in accordance with the present invention, and the test method thereof. In FIG. 2, a 16-byte (the fourth power of two) RAM is mounted, in which case, only lower four bits of the address bits are connected to the memory chip with the remaining address bits unused.

As described above, the RAM 5 is mounted by an amount expressed by the n-th power of two in this embodiment. Hence, the capacity of the RAM 5 can be confirmed by checking addresses at each of the n-th powers of two as shown by stars in FIG. 2.

Figure 3:
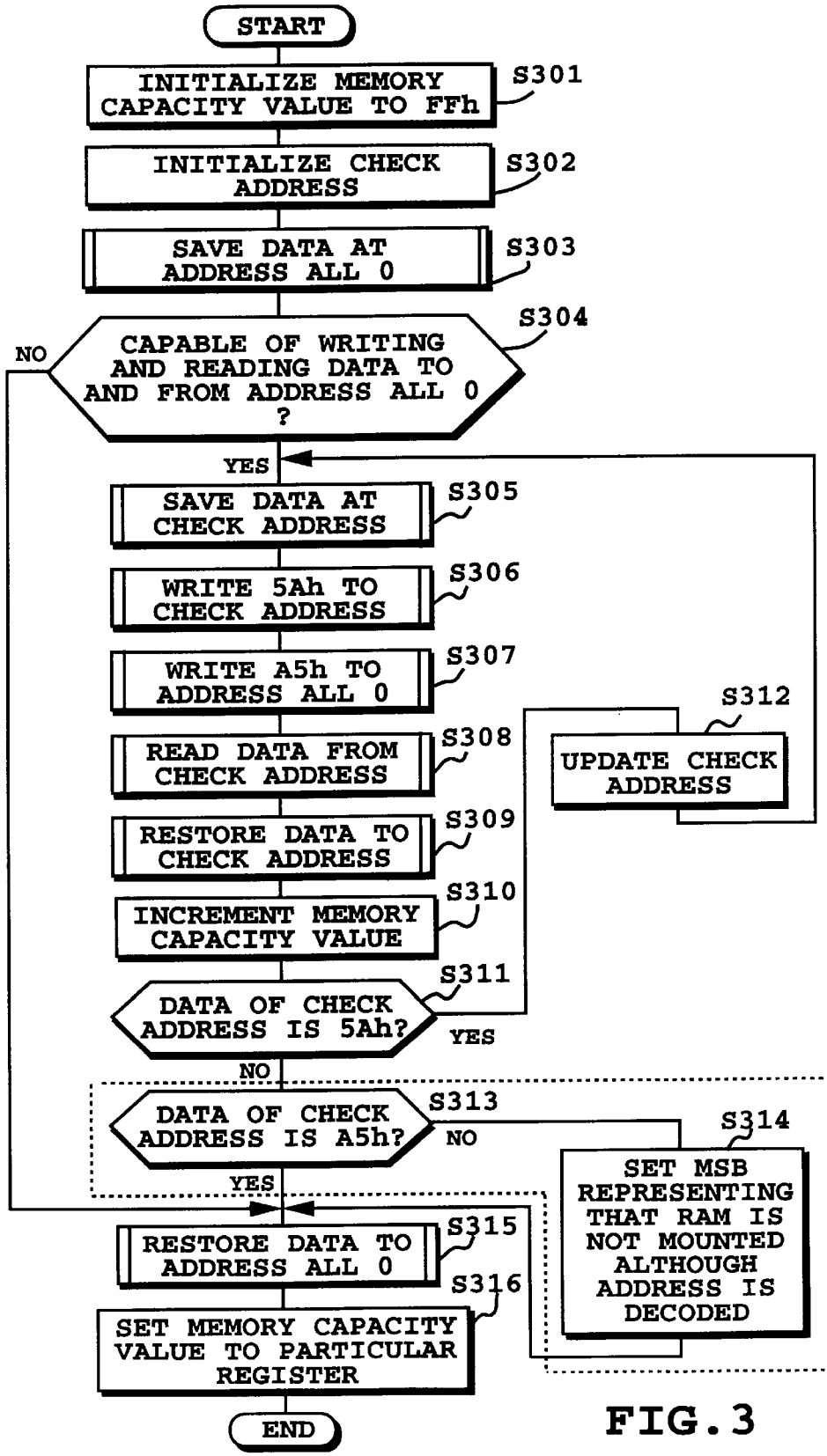
FIG. 3 is a flowchart showing a test method of the memory capacity in accordance with the present invention.

Thus, the embodiment applies a mounted memory test as shown in the flowchart of FIG. 3 to the memory actually mounted.

In FIG. 3, the CPU 1 first initializes the memory capacity value to FFh at step S301, where h denotes the hexadecimal notation. Subsequently, the CPU 1 initializes the check address to 00001h at step S302.

After that, the CPU 1 checks the address 0 at steps S303 and S304. Specifically, the CPU 1 clears the address bits to all zero, and saves the content of the address 0 in a register at step S303. Then, the CPU 1 writes data (for example, "5Ah") to the address 0, and checks whether the data can be read correctly or not at step S304. If the CPU 1 cannot read the data correctly, it sets FFh to a particular register as the memory capacity at step S316, which means that there is no memory mounted.

Figure 4:
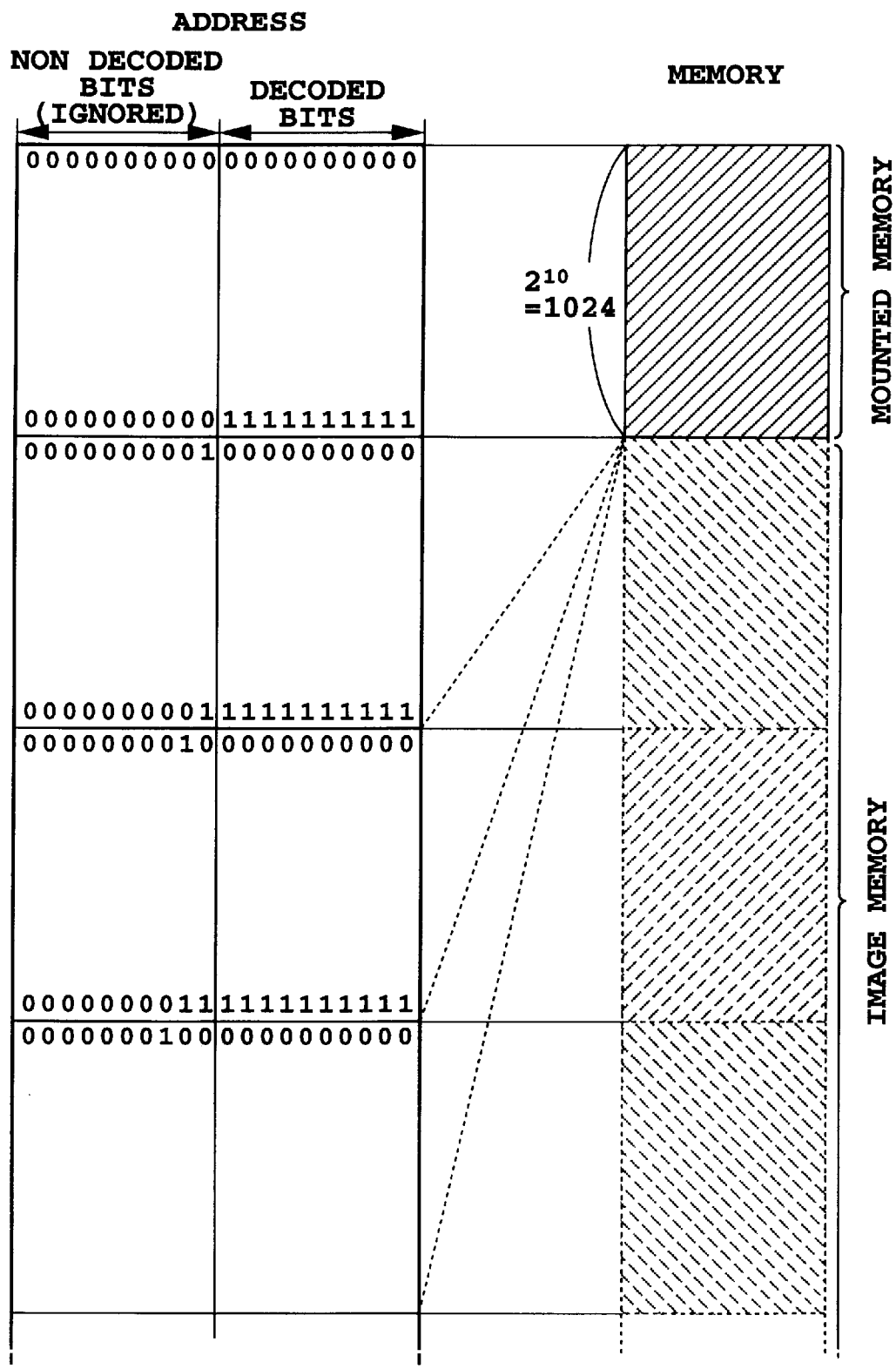
FIG. 4 is a schematic diagram illustrating the memory access on a memory mounted only part of a memory space.

When the CPU 1 can read the content of the address 0 correctly, this means that a memory is mounted. In this case, the CPU 1 checks the capacity of the memory through steps S305–S312. The capacity check can be achieved by checking the address 0 and the addresses to which the stars are attached in FIG. 2. The check of the address 0 corresponds to checking writing to the image memory described above in connection with FIG. 4. This will now be described in more detail with reference to FIG. 2.

First, the CPU 1 saves the data of the check address (the initialized value 00001h, now) at step S305, and writes, for example, data "5A" to the check address at step S306. At the next step S307, the CPU 1 writes to the address 0 data "A5", for example, which differs from that written to the check address, and then reads the content of the check address at step S308. Since the memory is mounted on the check address in this case, the data "5A" is read from the check address. Then, the CPU 1 restores the saved data to the check address at step S309, and increments the memory capacity value by one at step S310 to 00h from the initialized value FFh. Subsequently, the CPU 1 checks whether the value read from the check address equals "5A" at step S311. Since "5A" has been read from the memory in this case, the CPU 1 increments the check address at step S312. The increment is carried out by shifting the check address leftwards by one bit, resulting in the check address of 00002h.

The CPU 1 continues the check of the capacity by repeating this operation. When the CPU 1 starts the fifth processing of step S305 after completing the check processing four times, the check address is incremented to 00010h (address 16), and the memory capacity value is set at three.

The operation is repeated in this condition. Specifically, the CPU 1 saves the data of the check address 00010h at step S305, and writes the data "5A" to the check address at step S306. In this case, since no memory is mounted on the check address 00010h, the data is actually written to the address 00000h. Then, the CPU 1 writes to the address 00000h at step S307 data "A5" which differs from the data "5A" written to the check address. Subsequently, the CPU 1 reads the data from the check address at step S308.

In this case, since no memory is mounted on the check address, the data "A5" is read from the address 0. Then, the CPU 1 restores the saved data of the check address to the check address at step S309, and increments the memory capacity value of the memory by one at step S310. Since the memory capacity value was three, it becomes 04h by the increment.

Subsequently, the CPU 1 checks at step S311 whether the value read from the check address is "5A". Since the read value is "A5", the decision at step S311 is negative (NO).

The processings at steps S313 and S314 will be skipped here to be described later because they have nothing to do with the case where the upper address bits are ignored as described in connection with FIG. 2. The memory capacity value 04h when passing through step S311 is set to the particular register at step S316 after restoring the data of the address 0 at step S315.

Thus, when the RAM 5 is not mounted beyond the address 16, and the upper address bits representing these addresses are ignored, the address 16 actually points to the address 0. This means that when the CPU 1 reads the data at address 16, it actually reads the data at address 0.

The processings at steps S313 and S314 will now be described. The processings are necessary when the decoding is performed beyond the addresses on which the RAM is mounted, and when this must be detected by the CPU 1. Since the upper address bits are not ignored in this case, the check address will not point to the address 0.

In this case, the data which is thought to have been written to the address on which the RAM is not mounted cannot be read correctly. Thus, the decision at step S311 is negative (NO), and that at step S313 is also negative (NO) because the data written to the check address differs from "A5" which has been written to the address 0. The CPU 1 sets at step S314 the most significant bit (MSB) of the memory capacity value to 1, for example, to indicate that the RAM is not mounted on the check address, although the address is decoded. Thus, the CPU 1 can check the memory capacity of the mounted RAM as needed.

As described above, the present invention can check the capacity of the mounted memory even in a system in which the upper address bits are ignored.

In addition, the test method of the mounted memory can be applied to the capacity check of the memory cards 7 and 8 of FIG. 1.

The memory cards are connected to the bus in two ways as shown in FIG. 2: the memory card 7 is connected to the bus through the I/O interface 6, and the memory card 8 is directly connected to the bus.

When the memory card is connected to the bus through the I/O interface 6 as the memory card 7, its address is also set in a register in the I/O interface 6. In this case, since the address of the memory card 7 has nothing to do with the memory space of the CPU 1, it starts from address 0. Thus, the memory capacity of the memory card 7 can be identified by the method of FIG. 3.

When the memory card is connected directly to the bus as the memory card 8, the memory card is integrated into the memory space of the CPU 1. In this case, the capacity of the memory card can be identified by applying the foregoing method assuming that the initial address of the memory card in the memory space corresponds to the address 0 of FIG. 3.

The present invention has been described in detail with respect to an embodiment, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A memory capacity test method for testing capacity of a memory system which includes a memory mounted only on a portion of a memory space, and decodes only addresses of the portion of the memory space, said memory capacity test method comprising the steps of:

sequentially selecting a check address;

writing first data to said check address;

writing second data to an initial address of said portion on which said memory is mounted, said second data being different from said first data;

reading data on said check address;

checking whether said data read from said check address agrees with said first data; and deciding that the memory is not mounted on said check address if said data read from said check address disagrees with said first data.

2. A memory capacity test method for testing capacity of a memory space of a memory system, said memory capacity test method comprising the steps of:

sequentially selecting a check address;

writing first data to said check address;

writing second data to an initial address of a portion of said memory space on which a memory is mounted, said second data being different from said first data;

reading data on said check address;

checking whether said data read from said check address agrees with said first data or with said second data;

deciding that the memory is not mounted on said check address if said data read from said check address disagrees with said first data;

deciding that said check address is decoded but said memory is not mounted on said check address if said data read from said check address disagrees with the first data and the second data; and deciding that the memory is mounted on the check address if said data read from said check address agrees with said first data.

3. The memory capacity test method as claimed in claim 1, further comprising the step of deciding that no memory is mounted if data written to an initial address of an area, on which a memory is considered to be mounted, is not read correctly.

4. The memory capacity test method as claimed in claim 1, wherein said check address sequentially selected is set at an n-th power of two, where n is zero, or a positive integer.

5. A computer system comprising:

computer readable program code means for causing said computer system to sequentially select a check address from a memory;

computer readable program code means for causing said computer system to write first data to said check address;

computer readable program code means for causing said computer system to write second data to an initial address of a portion of a memory space of a memory system on which said memory is mounted, said second data being different from said first data;

computer readable program code means for causing said computer system to read data of said check address;

computer readable program code means for causing said computer system to check whether data read from said check address agrees with said first data; and computer readable program code means for causing said computer system to decide that the memory is not mounted on said check address if said data read from said check address disagrees with said first data.

* * * * *